(12) United States Patent
Fujiwara et al.

(10) Patent No.: US 7,564,075 B2
(45) Date of Patent: Jul. 21, 2009

(54) SEMICONDUCTOR DEVICE

(75) Inventors: Shuji Fujiwara, Hashima (JP); Tatsuhiko Koide, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 145 days.

(21) Appl. No.: 11/181,890

(22) Filed: Jul. 15, 2005

(65) Prior Publication Data
US 2006/0011944 A1 Jan. 19, 2006

(30) Foreign Application Priority Data
Jul. 16, 2004 (JP) ............... 2004-210074
Nov. 26, 2004 (JP) ............... 2004-342969

(51) Int. Cl.
*H01L 31/109* (2006.01)
(52) U.S. Cl. ............... 257/197; 257/196; 257/E29.188; 438/47; 438/235
(58) Field of Classification Search ......... 257/196–197, 257/11, 12, 51.85, 90, 94, 96, 97, 194, 200, 257/E33.015, E33.027, E21.371, E21.378, 257/E29.033, E29.188; 438/235, 309, 312, 438/47, 94, 172
See application file for complete search history.

(56) References Cited
U.S. PATENT DOCUMENTS
4,967,254 A * 10/1990 Shimura ............... 257/197
6,346,453 B1 * 2/2002 Kovacic et al. ............ 438/312
7,119,382 B2 * 10/2006 Sato et al. ............... 257/197
2004/0065875 A1 * 4/2004 Ohnishi et al. .............. 257/19
2004/0150004 A1 * 8/2004 Aoki et al. ............... 257/197

FOREIGN PATENT DOCUMENTS
JP 04-179235 6/1992
JP 11-87363 3/1999

OTHER PUBLICATIONS
Chinese Office Action issued in Chinese Patent Application No. CN 200510084695.7, dated Dec. 7, 2007.

* cited by examiner

*Primary Examiner*—Thinh T Nguyen
(74) *Attorney, Agent, or Firm*—McDermott Will & Emery LLP

(57) ABSTRACT

A semiconductor device provided with an emitter layer having a narrowed base contact portion. The semiconductor device includes a collector layer arranged on a semiconductor substrate. A conductive layer is arranged on the collector layer. A silicon film is arranged on the conductive layer. An emitter electrode is arranged on the silicon film. A first film covers the side of the emitter electrode. The silicon film includes a first region contacting the emitter electrode and a second region differing from the first region. A contact surface between the first region and the emitter electrode is located at a level that is higher than that of the lower surface of the first film. At least part of the second region of the silicon film is located between the conductive layer and the first film and is in contact with the conductive layer and the first film.

11 Claims, 6 Drawing Sheets

SEMICONDUCTOR DEVICE

CROSS-REFERENCE TO RELATED APPLICATIONS

This application is based upon and claims the benefit of priority from prior Japanese Patent Application No. 2004-210074, filed on Jul. 16, 2004, and Japanese Patent Application No. 2004-342969, filed on Nov. 26, 2004, the entire contents of which are incorporated herein by reference.

BACKGROUND OF THE INVENTION

The present invention relates to a semiconductor device, and more particularly, to a semiconductor device including a heterojunction bipolar transistor.

Portable electronic devices, such as cellular phones, PDAs, DVCs, and DSCs, have become to be provided with a larger number of functions. Further, there are demands for compact and light products in the market. To satisfy such demands, highly integrated system LSIs are necessary.

One example of a module that realizes a high integration system LSI is a high frequency bipolar transistor. One example of a configuration for increasing the performance of a high frequency bipolar transistor is a silicon-germanium heterojunction bipolar transistor (SiGe HBT), which includes a base layer formed from silicon-germanium (SiGe).

Figure 11:
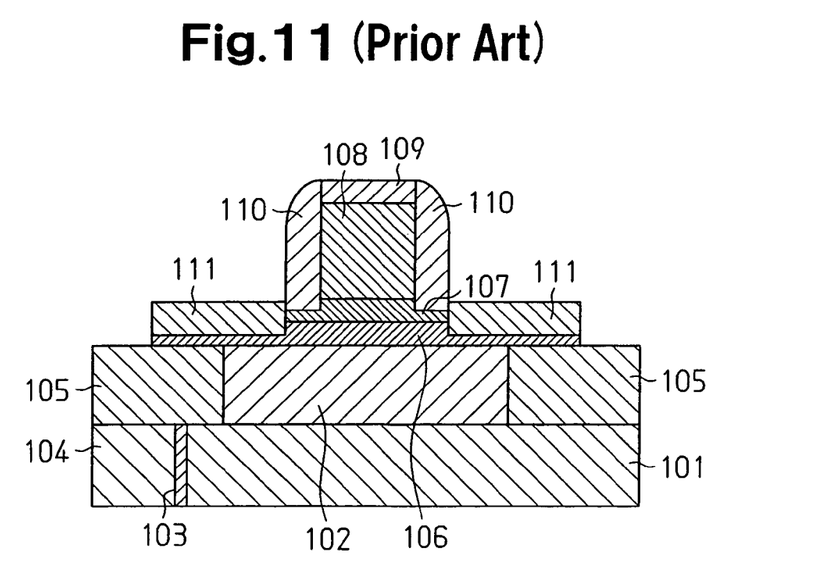
FIG. 11 is a cross-sectional view showing a conventional SiGe base heterojunction bipolar transistor.

Japanese Laid-Open Patent Publication No. 4-179235 describes a method for manufacturing a semiconductor device having a SiGe base heterojunction bipolar transistor, which is shown in FIG. 11. An enlarged view of an emitter-base region of the transistor is shown in FIG. 12.

Referring to FIG. 11, an $n^+$ type collector embedment layer 101 is formed on a $p^-$ type silicon substrate (not shown). An $n^-$ type layer 102 (epitaxial layer), which functions as a collector layer, is epitaxially grown on the $n^+$ type collector embedment layer 101. The $n^-$ type layer 102 is etched to remove portions excluding portions required for use as the collector layer and a collector extraction layer. A trench is formed in a device isolation region. A polycrystalline silicon film 104 is embedded in the trench via an oxide film 103. After the collector formation and device isolation region embedment, the substrate surface is flattened by an oxide film 105 (embedment oxide film). The oxide film 105 undergoes epitaxial growth to form a base and an emitter. More specifically, a p-type SiGe layer 106 (SiGe alloy layer), which functions as an internal base layer, is epitaxially grown. An n-type silicon layer 107, which functions as an emitter layer, and an $n^+$ type silicon layer 108, which functions as an emitter-contact layer (emitter electrode), are epitaxially grown on the p-type SiGe layer 106. Then, the $n^+$ type silicon layer 108 and the n-type silicon layer 107 are etched using an oxide film 109 as a mask to remove portions excluding portions required to form the emitter. The outer side of the region functioning as the internal base layer in the residual p-type SiGe layer 106 is etched for a predetermined depth using an oxide film 110 (side wall film) and the oxide film 109 as masks. This portion then undergoes selective epitaxial growth to form a $p^+$ type SiGe layer 111, which functions as an external base layer.

Figure 12:
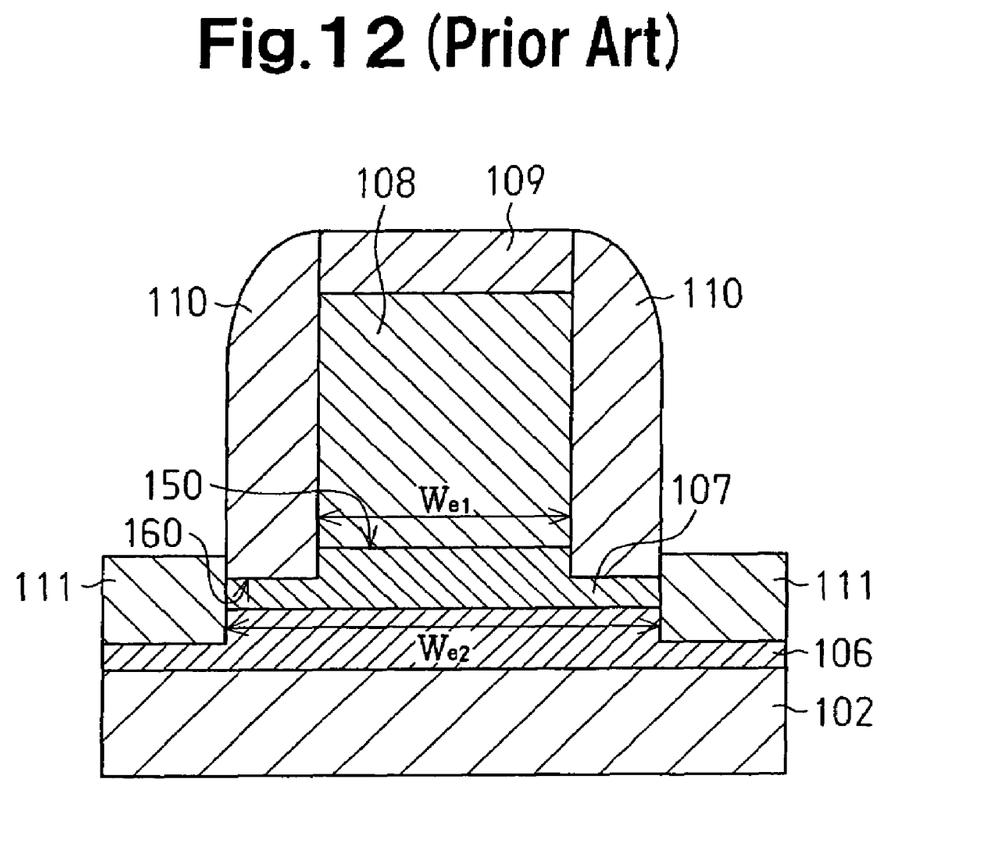
FIG. 12 is an enlarged partial view showing the transistor of FIG. 11.

In the SiGe base heterojunction bipolar transistor configuration of the prior art shown in FIG. 12, the n-type silicon layer 107, which functions as the emitter layer, is T-shaped and has a center projection (expansion portion). A contact surface 150 defined between the emitter layer 107 and the emitter electrode 108 is located at a position higher than a lower surface 160 of the side wall film 110. An emitter-base junction is formed at the lower side of the center projection. Accordingly, the width $W_{e2}$ of the portion corresponding to the emitter-base junction (width of emitter layer) is much greater than the width $W_{e1}$ of the $n^+$ type silicon layer 108 (emitter electrode).

To manufacture a semiconductor device (SiGe base heterojunction bipolar transistor) that has higher performance with the prior art configuration, the $n^+$ type silicon layer 108 (emitter electrode) must further be processed in a miniaturized manner to decrease the width $W_{e1}$, which would further decrease the width $W_{e2}$ of the emitter layer. However, this would result in the need of a highly accurate exposure apparatus and thus increase manufacturing costs.

SUMMARY OF THE INVENTION

It is an object of the present invention to provide a semiconductor device having an emitter layer narrowed at portions corresponding to an emitter-base junction.

One aspect of the present invention is a semiconductor device including a semiconductor substrate, a collector layer arranged on the semiconductor substrate, a conductive layer arranged on the collector layer for functioning as a base layer, a silicon film arranged on the conductive layer, an emitter electrode arranged on the silicon film and having a side surface, and a first film, having a lower surface, for covering the side surface of the emitter electrode. The silicon film includes a first region for functioning as an emitter layer that contacts the emitter electrode, and a second region that differs from the first region. A contact surface between the first region and the emitter electrode is located at a level that is higher than that of the lower surface of the first film. At least part of the second region of the silicon film is located between the conductive layer and the first film and is in contact with the conductive layer and the first film.

Another aspect of the present invention is a semiconductor device including a semiconductor substrate, a collector layer arranged on the semiconductor substrate, a conductive layer arranged on the collector layer for functioning as a base layer, a silicon film arranged on the conductive layer, an emitter electrode arranged on the silicon film and having a side surface, and a first film having a lower surface for covering the side surface of the emitter electrode. The silicon film includes an emitter layer having an upper surface that contacts the emitter electrode, and a silicon region excluding the emitter layer. The upper surface of the emitter layer is located at a level that is higher than the level of the lower surface of the first film. The emitter layer is located near the center of the silicon film. The silicon region includes a lower portion located underneath the emitter layer and a peripheral portion surrounding the periphery of the emitter layer. The peripheral portion of the silicon region is located between the conductive layer and the first film in contact with both of the conductive layer and the first film.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor device according to a first embodiment of the present invention will now be discussed. Like or same reference numerals are given to those components that are the same or similar in all drawings.

Figure 1:
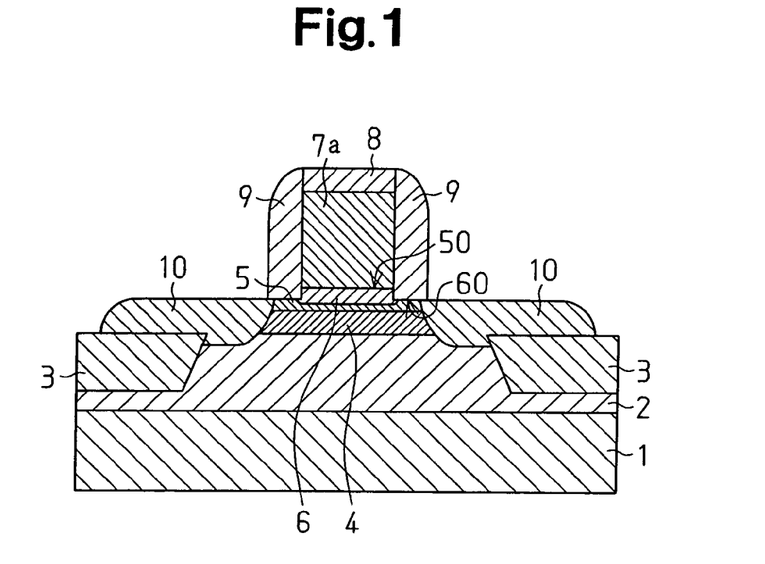
FIG. 1 is a cross-sectional view showing a semiconductor device according to a first embodiment of the present invention.
Figure 2:
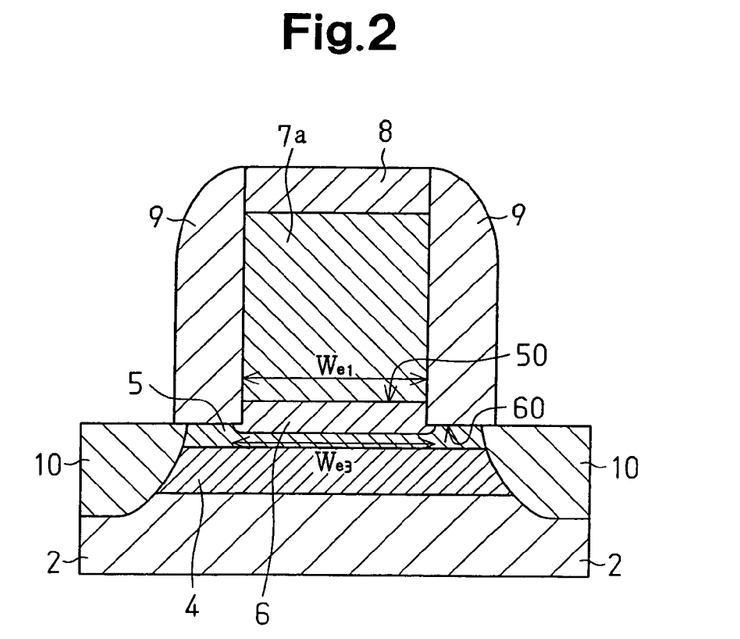
FIG. 2 is an enlarged partial view showing the semiconductor device of FIG. 1.

FIG. 1 is a cross-sectional view showing a SiGe base heterojunction bipolar transistor of the first embodiment. FIG. 2 is an enlarged partial view of FIG. 1 showing an emitter-base region.

Referring to FIG. 1, an epitaxial layer 2, which functions as a collector layer, is formed on a silicon substrate 1. A device isolation region 3 is formed in parts of the epitaxial layer 2 by performing a shallow trench isolation (STI) technique. An SiGe alloy layer 4, which functions as a base region, is formed on the epitaxial layer 2. A silicon film 5 and an n-type diffusion layer 6, which functions as an emitter layer, is formed on the SiGe alloy layer 4. The n-type diffusion layer 6 is formed by diffusing n-type impurities into the silicon film 5, which is T-shaped prior to the diffusion. A polycrystalline silicon film 7a and a silicon nitride film 8 are formed on the n-type diffusion layer 6. The n-type diffusion layer 6, the polycrystalline silicon film 7a, and the silicon nitride film 8 are surrounded by a side wall film 9 (side wall). A contact surface 50 defined between the n-type diffusion layer 6 and the polycrystalline silicon film 7a is located at a position higher than a lower surface 60 of the side wall film 9. In other words, the distance between the contact surface 50 and the silicon substrate 1 is greater than that between the lower surface 90 of the side wall film 9 and the silicon substrate 1. Further, the silicon film 5 is located between the side wall film 9, which is formed from an insulation film, and the SiGe alloy layer 4, and is in contact with the side wall film 9 and the SiGe alloy layer 4. A p$^+$ diffusion layer 10 connected to the base region is formed around the silicon film 5.

In the present invention, the SiGe alloy layer 4 functions as a conductive layer, the silicon film 5 functions as a second region, the n-type diffusion layer 6 functions as a first region, the side wall film 9 functions as a first film, and the polycrystalline silicon film 7a functions as an emitter electrode.

As shown in FIG. 12, in the emitter layer of the prior art configuration, the portion corresponding to the emitter-base has width $W_{e2}$. In comparison, as shown in FIG. 2, in the first embodiment of the present invention, the silicon film 5, which has the same sizes as in the prior art, includes the first region 6 and the second region. The first region 6 functions as the emitter layer. The portion corresponding to the emitter-base junction (emitter-base junction portion) is formed beneath the emitter layer 6. Thus, the emitter-base junction has a width $W_{e3}$, which is less than the width of the interface between the silicon film 5 and the SiGe alloy layer 4 (corresponding to the width $W_{e2}$ of FIG. 12). The diffusion of n-type impurities into the silicon film 5 may be controlled to substantially equalize the width of the emitter layer 6, or the width $W_{e3}$ of the junction, with the width $W_{e1}$. This enables the narrowing of the emitter layer 6 without having to use a high accuracy exposure apparatus. By narrowing the emitter layer 6, that is, by equalizing the width with $W_{e3}$ or $W_{e1}$, in comparison with when the interface between the silicon film 5 and the SiGe alloy layer is $W_{e2}$, the same current density is obtained with less current. Thus, the transistor may be formed with less power consumption. This enables the manufacture of a semiconductor device having high performance.

In the first embodiment of the present invention, only part of the silicon film 5 is located between the SiGe alloy layer 4 and the side wall film 9 and is in contact with the SiGe alloy layer 4 and the side wall film 9. Thus, the area of the emitter-base junction is reduced from that in the prior art configuration (when the silicon film also functions as the emitter layer). Thus, in comparison with the prior art configuration, the transistor (semiconductor device) has a junction volume that is less by an amount corresponding to the reduced junction area.

The procedures for manufacturing the semiconductor device according to the first embodiment of the present invention will now be described with reference to FIGS. 3 to 9.

Figure 3:
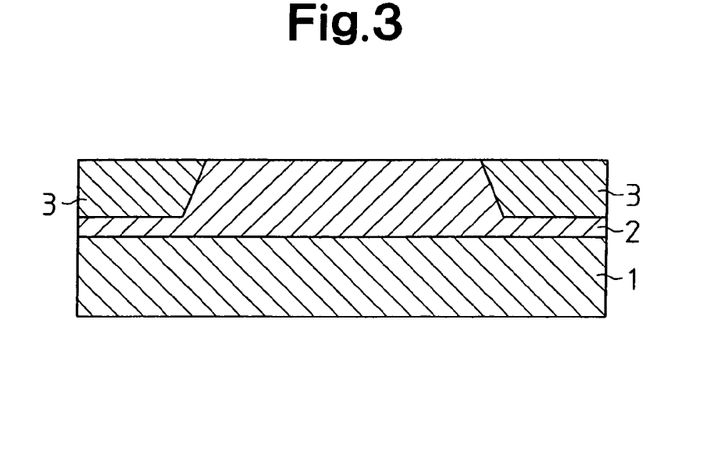
FIGS. 3 to 9 are cross-sectional views showing procedures for manufacturing the semiconductor device in the first embodiment.

[Step 1: FIG. 3] The device isolation region 3 is formed on the p-type silicon substrate 1 through, for example, the STI technique. Then, n-type impurities are ion-implanted and activated to form the collector layer 2. For example, phosphorous (P) is implanted with an acceleration energy of about 500 to 4000 keV to obtain a concentration of about $3 \times 10^{13}$ cm$^{-2}$ to $3 \times 10^{15}$ cm$^{-2}$.

Figure 4:
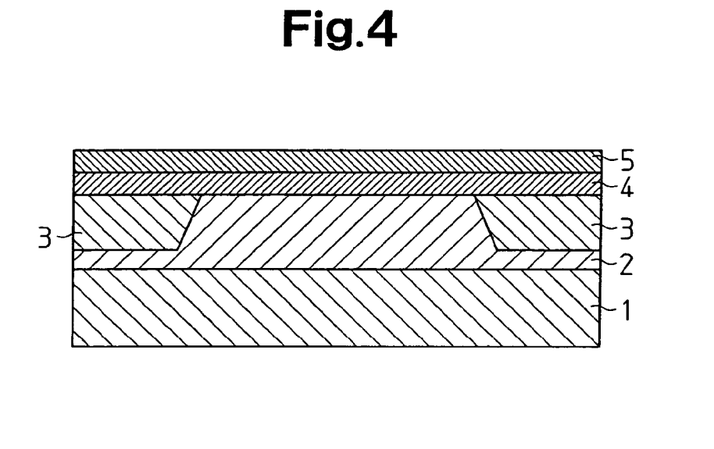

[Step 2: FIG. 4] Low pressure chemical vapor deposition (CVD) is performed to epitaxially grow the silicon-germanium (SiGe) alloy layer 4, in which boron (B) is doped at a concentration about $1 \times 10^{19}$ cm$^{-3}$, and the silicon film 5, which does not contain germanium (Ge). The SiGe alloy layer 4 and the silicon film 5 each have a thickness of 10 nm to 100 nm.

The Ge concentration in the SiGe alloy layer 4 may be uniform throughout the layer. However, if the Ge concentration has an inclined profile in which it gradually increases from the side contacting the silicon film 5 toward the collector layer 2, this would shorten the time electrons travel through the base and form a transistor that operates at high speeds. In such a case, it is preferred that the Ge concentration substantially be about 0% at the side contacting the silicon film 5 and about 15% to 20% at the side contacting the collector layer 2.

The silicon film 5 may either be doped with boron (B), in the same manner as the SiGe alloy layer 4, or not doped with boron.

Further, prior to formation of the SiGe alloy layer 4, low pressure CVD may be performed to epitaxially grow a silicon film that does not include boron (B) or an SiGe alloy layer that does not include boron (B).

Figure 5:
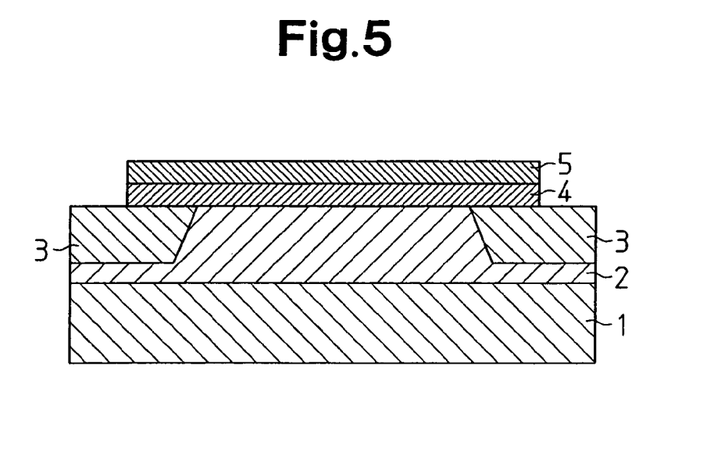

[Step 3: FIG. 5] Next, lithography is performed to form a resist pattern. Then, dry etching is performed to remove unnecessary portions of the silicon film 5 and the SiGe alloy layer 4.

Figure 6:
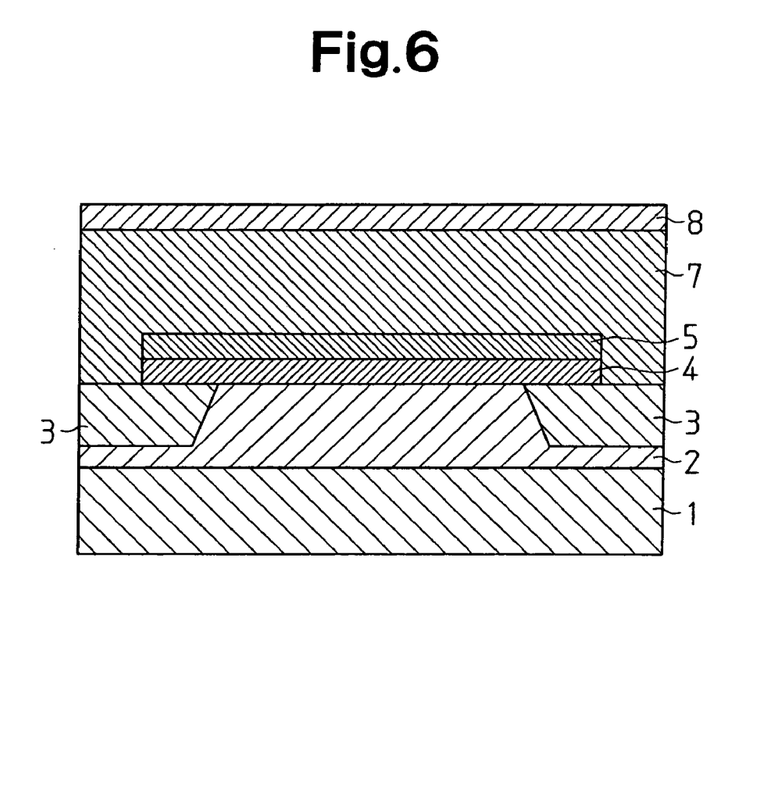

[Step 4: FIG. 6] Low pressure CVD is performed to form the polycrystalline silicon film 7 in which n-type impurities are doped at a concentration about $1 \times 10^{20}$ cm$^{-3}$ or more. Then, the silicon nitride film 8 is formed. For example, arsenic (As) or phosphorus (P) may be used as the n-type impurities. The thickness of the polycrystalline silicon film 7 is about 100 nm to 300 nm, and the thickness of the silicon nitride film 8 is about 50 nm to 200 nm.

Figure 7:
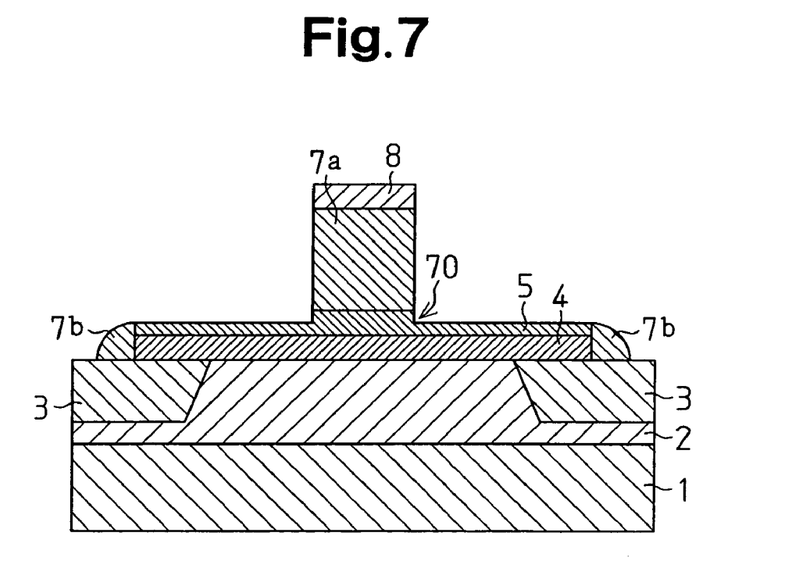

[Step 5: FIG. 7] Lithography is performed to form a resist pattern. Then, dry etching is performed to sequentially etch the silicon nitride film 8, the polycrystalline silicon film 7, and the silicon film 5. Dry etching is performed so as not to completely remove the silicon film 5 and is terminated in a state in which the silicon film 5 partially remains on the entire surface of the SiGe alloy layer 4. In this state, the polycrystalline silicon film 7 is processed to form a polycrystalline silicon film 7a, which functions as an emitter electrode, and a side wall film 7b, which is a polycrystalline silicon film surrounding the SiGe alloy layer 4 and the silicon film 5.

Figure 8:
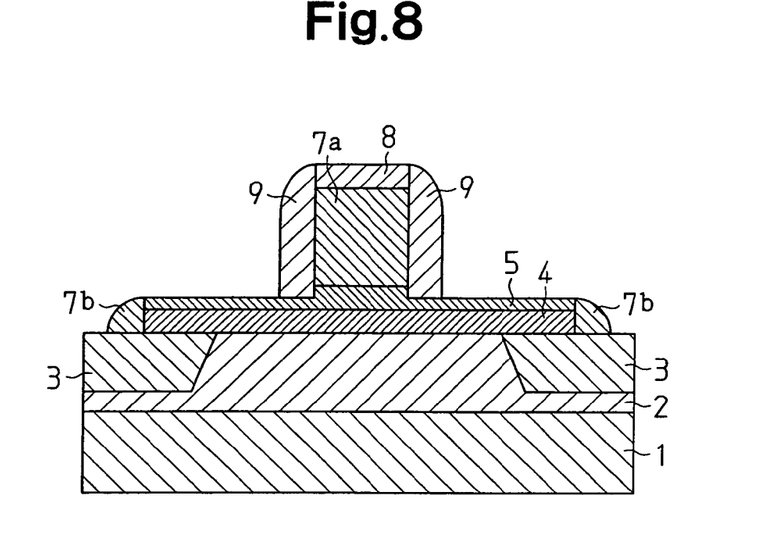

[Step 6: FIG. 8] CVD is performed to form a silicon oxide film. Then, dry etching is performed to carry out complete surface etch back and form the side wall film 9, which is a silicon oxide film, around the silicon nitride film 8, the polycrystalline silicon film 7a, and the center projection of the silicon film 5. The silicon oxide film is formed by performing heat treatment with a gas mixture of tetraethoxysilane (TEOS) and oxygen ($O_2$) and has a thickness of about 100 nm to 400 nm.

Figure 9:
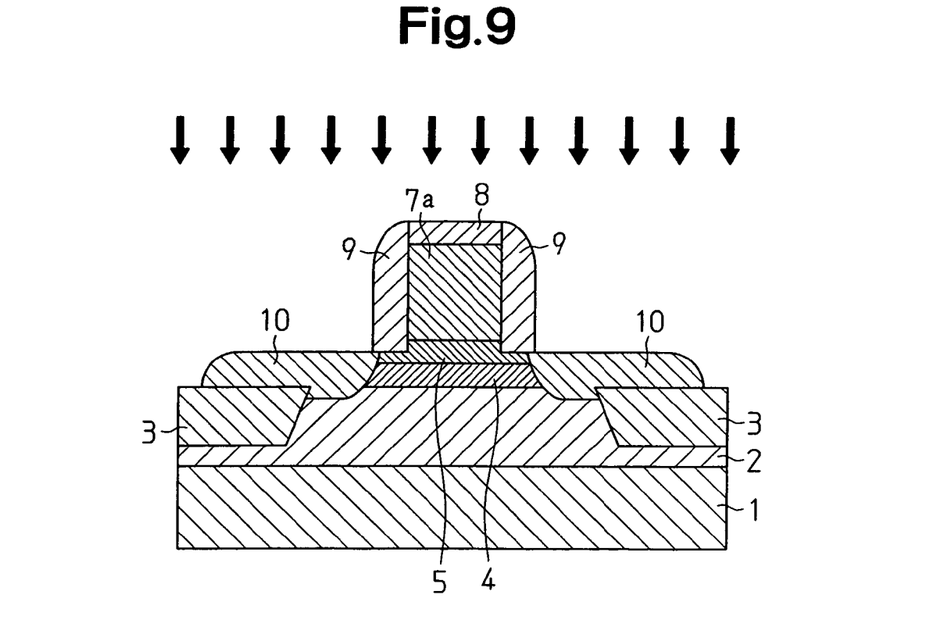

[Step 7: FIG. 9] Boron (B) is ion-implanted and then activated by performing a heat treatment to form the $p^+$ diffusion layer 10. The ion implantation condition is, for example, implanting $BF_2$ at an amount of $1 \times 10^{14}$ cm$^{-2}$ to $5 \times 10^{15}$ cm$^{-2}$ with an acceleration energy of 1 keV to 30 keV. Under this implantation condition, ions do not pass through the silicon nitride film 8, which is arranged on the polycrystalline silicon film 7a and has a thickness of about 100 nm. Thus, boron is not implanted into the polycrystalline silicon film 7a.

[Step 8: FIG. 1] Next, heat treatment is performed to diffuse the n-type impurities of the polycrystalline silicon film 7a into the silicon film 5 and form the n-type diffusion layer 6. As a result, the emitter base junction is formed in the silicon film 5. The heat treatment is performed with an RTA apparatus under a temperature of about 1050° C. for a period of 5 to 30 seconds.

The emitter layer, or n-type diffusion layer 6, which is formed in the silicon film 5, is formed by diffusing the n-type impurities from the polycrystalline silicon film 7a. However, the diffusion occurs in the lateral direction in addition to the depth-wise direction. Thus, the effective emitter width may become greater than the width of the polycrystalline silicon film 7a. Nevertheless, in the first embodiment of the present invention, the contact surface 50 defined between the emitter layer (n-type diffusion layer 6) and the emitter electrode (polycrystalline silicon film 7a) is located at a position higher than the lower surface 60 of the side wall film 9. Thus, the side wall film 9 functions as a diffusion barrier and prevents diffusion of the n-type diffusion layer 6 in the lateral direction. This decreases the width of the emitter layer.

Finally, although not shown in the drawings, after removing the silicon nitride film 8, cobalt (Co) or titanium (Ti) are formed on the polycrystalline silicon film 7a and the p+ diffusion layer 10. Then, heat treatment is performed to form a cobalt silicide film or a titanium silicide film. An interlayer insulation film, such as a plasma TEOS film, is deposited on the surface of a semiconductor substrate. Further, a contact hole is formed in a collector electrode portion, a base electrode portion, and an emitter electrode portion of an NPN transistor. Then, a bimetal layer, made of titanium or the like, and a conductive layer, made of aluminum or aluminum alloy, are formed. This manufactures a bipolar transistor having an NPN transistor.

In the first embodiment, the width $W_{e3}$ of the first region, which is the emitter layer, is less than the width ($W_{e3}$ in FIG. 12) of the interface between the silicon film 5 and the conductive layer 4. In comparison with the configuration in which the width of the emitter layer 160 is equal to the width $W_{e3}$ of the interface between the silicon film and the conductive layer 106, the configuration of the first embodiment obtains the same current density with less current and obtains a high current amplification rate. This enables the manufacture of a transistor having low power consumption. Further, only part (i.e., the peripheral portion) of the second region, or the silicon film 5, is located between the conductive layer 4 and the first film 9 and in contact with the conductive layer 4 and the first film 9. Thus, the area of the portion corresponding to the emitter-base junction is smaller in comparison with the prior art configuration (FIG. 12) in which the second region also functions as the emitter layer. This enables the manufacture of a transistor with a junction volume reduced in accordance with the reduced junction area. As a result, the semiconductor device of the present invention has high performance.

In the first embodiment, the contact surface 50 between the first region 6 and the emitter electrode 7a is located at a position higher than the lower surface 60 of the first film 9. Thus, the first film 9 functions as an impurity dispersion barrier and prevents diffusion of impurities in the lateral direction. This decreases the width $W_{e3}$ of the first region 6 with satisfactory controllability.

In the first embodiment, the SiGe alloy layer 4 has a band gap that is narrower than that of the silicon film 5. In comparison with when the lower surface of the first region 6 does not reach the conductive layer (when the lower surface of the first region 6 is in the silicon film), the barrier for electrons injected into the base layer from the emitter layer is lowered. As a result, the emitter injection efficiency is high, a higher current amplification rate is obtained, and a semiconductor device with higher performance is manufactured.

Figure 10:
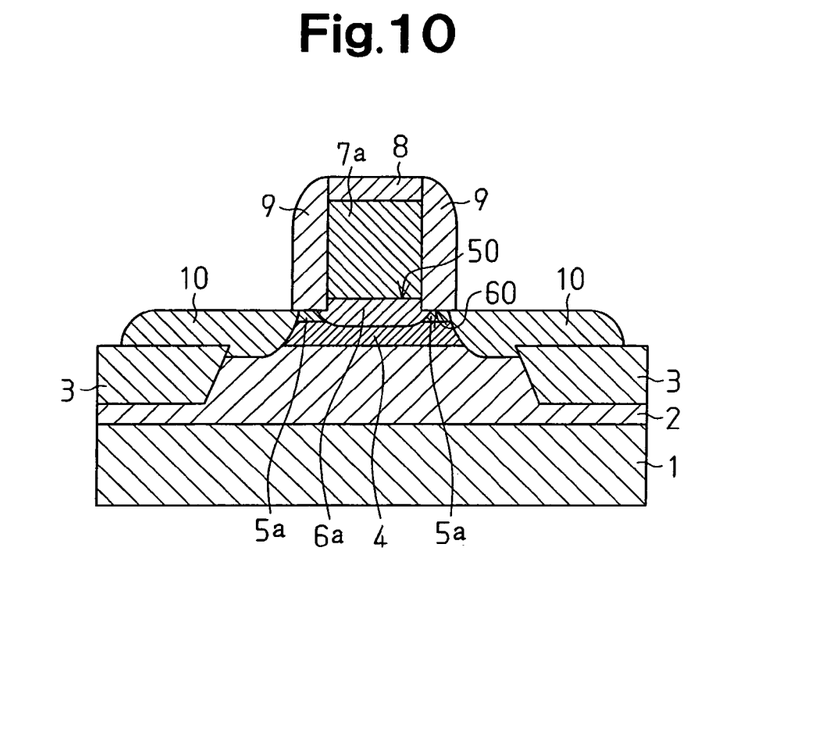
FIG. 10 is a cross-sectional view showing a semiconductor device according to a second embodiment of the present invention.

FIG. 10 is a cross-sectional view showing an SiGe base heterojunction bipolar transistor according to a second embodiment of the present invention. The second embodiment differs from the first embodiment in that the lower surface of the n-type diffusion layer 6 extends into the SiGe alloy layer 4.

In the second embodiment, a silicon film 5a functions as a second region, and an n-type diffusion layer 6a functions as a first region.

Since the lower surface of the n-type diffusion layer 6a extends into the SiGe alloy layer 4, in comparison to when the lower surface is separated from the SiGe alloy layer 4, the distance from the lower surface of the n-type diffusion layer 6a, which functions as an emitter layer, to the collector layer 2 is shortened. This reduces the travel time of the electrons moving through the collector layer from the side of the emitter layer and forms a transistor that operates at high speeds. Accordingly, a semiconductor device with higher performance is manufactured.

To manufacture the semiconductor device according to the second embodiment of the present invention, in step 2 of the first embodiment, low pressure CVD is performed to form the silicon film 5a with a thickness of about 30 nm. Further, in step 8, an RTA apparatus is used to perform heat treatment under a temperature of about 1050° C. for a period of about five seconds. This diffuses the n-type impurities in the polycrystalline silicon film 7a toward the collector layer 2 for about 40 nm. Thus, the n-type impurities pass through the silicon film 5a, which has a thickness of about 30 nm, and reach the SiGe alloy layer 4. As a result, in comparison to when the lower surface of the n-type diffusion layer 6a (emitter-base junction) does not extend into the SiGe alloy layer 4 (when the lower surface of the n-type diffusion layer 6a is located in the silicon film 5a), the emitter injection efficiency is high and the current amplification rate is increased. This is because if the lower surface of the n-type diffusion layer 6a is located in the SiGe alloy layer, the band gap of the SiGe alloy layer is narrower than that of the silicon film. Hence, in comparison to when the lower surface of the n-type diffusion layer 6a is located in the silicon film 5a, the height of the barrier that obstructs electrons injected in the base layer from the emitter layer is decreased. Due to the decreased height of the barrier that obstructs the electrons injected in the emitter layer from the base layer, the emitter injection efficiency is increased. This obtains a high current amplification rate. Accordingly, a semiconductor device with higher performance is manufactured.

The second embodiment has the same advantages as the first embodiment.

In the present invention, the conductive layer includes a conductive semiconductor due to the p-type or n-type impurities.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified and applied to various types of bipolar transistors within the scope and equivalence of the appended claims.

What is claimed is:

1. A semiconductor device comprising:
   a semiconductor substrate;
   a collector layer arranged on the semiconductor substrate;
   a conductive layer, arranged on the collector layer, for functioning as a base layer;
   a silicon film arranged on the conductive layer;
   an emitter electrode arranged on the silicon film and having a side surface; and
   a first film, having a lower surface, for covering the side surface of the emitter electrode, the first film provided as a diffusion barrier that prevents diffusion of impurities from the emitter electrode to the silicon film in a lateral direction, wherein:
   the silicon film includes a diffusion layer as a first region of the silicon film that contacts the emitter electrode and functions as an emitter layer, and a second region that is a region other than the diffusion layer;
   a contact surface between the diffusion layer and the emitter electrode is located at a level that is higher than that of the lower surface of the first film; and
   at least part of the second region of the silicon film is located between the conductive layer and the first film and is in contact with the conductive layer and the first film.

2. The semiconductor device according to claim 1, wherein the emitter electrode includes impurities, and the diffusion layer includes impurities diffused from the emitter electrode to the silicon film.

3. The semiconductor device according to claim 1, wherein the conductive layer is a silicon-germanium alloy layer, and the diffusion layer has a lower surface that extends into the conductive layer.

4. The semiconductor device according to claim 1, wherein the distance between the contact surface between the diffusion layer and the emitter electrode and the semiconductor substrate is greater than the distance between the lower surface of the first film and the semiconductor substrate.

5. A semiconductor device comprising:
   a semiconductor substrate;
   a collector layer arranged on the semiconductor substrate;
   a conductive layer arranged on the collector layer for functioning as a base layer;
   a silicon film arranged on the conductive layer;
   an emitter electrode arranged on the silicon film and having a side surface; and
   a first film, having a lower surface, for covering the side surface of the emitter electrode, the first film provided as a diffusion barrier that prevents diffusion of impurities from the emitter electrode to the silicon film in a lateral direction, wherein:
   the silicon film includes an emitter layer having an upper surface that contacts the emitter electrode, and a silicon region excluding the emitter layer, the upper surface of the emitter layer being located at a level that is higher than the level of the lower surface of the first film;
   the emitter layer is located near the center of the silicon film; a periphery of the silicon region is located between the conductive layer and the first film in contact with both of the conductive layer and the first film.

6. The semiconductor device according to claim 5, wherein the emitter electrode includes impurities, and the emitter layer includes impurities diffused from the emitter electrode to the silicon film.

7. The semiconductor device according to claim 5, wherein the conductive layer is a silicon-germanium alloy layer, and the emitter layer has a lower surface that extends into the conductive layer.

8. The semiconductor device according to claim 5, wherein the distance between a contact surface between the emitter layer and the emitter electrode and the semiconductor substrate is greater than the distance between the lower surface of the first film and the semiconductor substrate.

9. The semiconductor device according to claim 5, wherein a lower portion of the silicon region contacts only the conductive layer.

10. The semiconductor device according to claim 5, wherein:
    the first film is a tubular side wall extending along the side surface of the emitter electrode, the side wall having a first width measured along a plane parallel to the semiconductor substrate; and
    the emitter layer has a second width measured along a plane parallel to the semiconductor substrate, the second width being smaller than the first size.

11. The semiconductor device according to claim 10, wherein the silicon film has a third width measured along a plane parallel to the semiconductor substrate, the third width being smaller than the first width but greater than the second width.

* * * * *